(12) United States Patent
Chen (10) Patent No.: US 6,265,272 B1
(45) Date of Patent: Jul. 24, 2001

(54) METHOD OF FABRICATING A SEMICONDUCTOR DEVICE WITH ELEVATED SOURCE/DRAIN REGIONS

(75) Inventor: Yi-Shi Chen, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/671,592

(22) Filed: Sep. 28, 2000

Related U.S. Application Data (62) Division of application No. 09/221,154, filed on Dec. 28, 1998.

(30) Foreign Application Priority Data

May 20, 1998 (TW) .................................................. 87107857

(51) Int. Cl.[7] .................................................. H01L 21/00
(52) U.S. Cl. .......................... 438/300; 438/592; 438/305
(58) Field of Search ............................. 438/300, 592, 438/305

(56) References Cited

U.S. PATENT DOCUMENTS

| 5,079,180 | * | 1/1992 | Rodder et al. . | |
| 5,200,352 | * | 4/1993 | Pfiester . | |
| 5,677,214 | * | 10/1997 | Hsu . | |
| 5,798,278 | * | 8/1998 | Chan et al. . | |
| 5,872,039 | * | 2/1999 | Imai | 438/291 |
| 5,879,998 | * | 3/1999 | Krivokapic | 438/300 |
| 5,902,125 | * | 5/1999 | Wu | 438/300 |
| 6,015,740 | * | 1/2000 | Milic-Strkalj | 438/300 |
| 6,063,676 | * | 5/2000 | Choi et al. | 438/299 |
| 6,087,235 | * | 7/2000 | Yu | 438/300 |

* cited by examiner

Primary Examiner—Richard Booth
(74) Attorney, Agent, or Firm—Nath & Associates PLLC; Harold L. Novick (57) ABSTRACT

A fabrication process of forming a semiconductor device with elevated source/drain regions on a substrate is disclosed. The elevated portion of the source/drain regions is provided as a reactant for a later metallization process, thereby preventing the consumption of too much silicon contained in the source/drain regions. First, an elevated silicon layer is formed on portions of a substrate for forming source/drain regions of a semiconductor device. Next, a gate dielectric layer and a gate electrode layer are formed on the elevated silicon layer successively to construct a gate structure. Then, a lightly doped ion implantation process, a process of forming a sidewall spacer and a heavily doped ion implantation process are performed successively. Thus, the elevated silicon layer can be used as a reactant while performing a self-aligned silicidization process.

5 Claims, 6 Drawing Sheets

METHOD OF FABRICATING A SEMICONDUCTOR DEVICE WITH ELEVATED SOURCE/DRAIN REGIONS

This Preliminary Amendment is for the divisional application of parent application Ser. No. 09/221,154, filed Dec. 28, 1998, and hereby incorporated herein by reference,

BACKGROUND OF THE INVENTION

1. Field of the Invention

This invention relates in general to the field of semiconductor device fabricating process, and more particularly to a method of fabricating a metal-oxide semiconductor (MOS) device suitable for using in the deep sub-micron process. The produced MOS device has elevated source/drain regions. Later, when performing a self-aligned silicidization process, the elevated source/drain regions are reacted to form a metal silicide. This can prevent ultra-shallow junction structure damage and thus improve product yield.

2. Description of Related Art

With the continuous progress in semiconductor manufacture technology, process precision has come into a so-called deep sub-micron era. In the deep sub-micron process, many device coefficients (such as the line width) are much smaller than that in prior art devices. Although utilizing electrical devices with smaller size provides the advantage of high integration, the manufacturing process itself is more difficult than ever. This invention is intended for a MOS transistor with shallow junction structure and provides a novel solution for preventing the shallow junction damage of a miniature device when performing a self-aligned silicidization process.

A shallow junction structure is mainly used in the source/drain regions of a MOS device. By forming shallow junction source/drain doped regions, lateral diffusion can be prevented and thus the properties of the MOS device are improved. As the process resolution increases, the source/drain regions of a MOS device are becoming even shallower. After completing the fabrication of a MOS device (wherein the gate electrode as well as the source/drain regions are fabricated), a self-aligned silicidization process is performed to form a metal silicide layer on the gate electrode and the source/drain regions, thus improving the junction characteristics between the device electrodes and the interconnects (i.e., reducing the contact resistivity). Such a self-aligned silicidization process, however, would probably cause the problem of shallow junction damage if a deep sub-micron process were conducted.

In a conventional self-aligned silicidization process, a metal layer, such as a titanium (Ti) layer, is sputtered on the device. By providing a high temperature, the metal layer is reacted with the silicon ingredient to form a metal silicide layer (e.g. titanium silicide, $TiSi_x$). The un-reacted portion of the metal layer, such as that over the sidewall spacer of a gate electrode, is then removed. Thus, the desired metal silicide structure is achieved. As has been described above, not only the sputtered metal layer but also the silicon layers of the device are needed to execute the silicidization process. That is, a certain amount of silicon in the device is lost in the self-aligned silicidization process. For a shallow junction MOS device, it would consume too much intrinsic silicon in the source/drain regions and then cause damage to the shallow junction structure.

Regarding the above problem, most of the solutions currently in use intend to provide an additional silicon ingredient for the self-aligned silicidization process, thereby preventing the consumption of too much silicon in the source/drain regions. For example, after forming the electrodes of the semiconductor device (such as the gate electrode and the source/drain regions), a silicon implantation process is performed to provide additional silicon on the source/drain regions, or a selective epitaxial process is conducted to deposit additional silicon on the source/drain regions. Therefore, this additional silicon ingredient can be used to react with a metal layer to form the metal silicide layer without having to consume the intrinsic silicon of the source/drain regions.

However, since the solutions currently used are performed after finishing the semiconductor device fabrication, several problems occur. For example, the silicon implantation process not only adds the silicon ingredient to the source/drain regions, but also adds the silicon ingredient to other undesired areas, such as the sidewall spacer of the gate electrode. That is, the presence of the silicon ingredient outside the source/drain regions could cause a reaction with the metal layer to form a metal silicide layer, resulting in a short circuit problem. On the other hand, although the selective epitaxial process is able to form a silicon layer onto the desired area, a relatively high temperature of about 800° C. to 1100° C. is required. This would therefore raise the production cost and reduce the manufacturing efficiency.

SUMMARY OF THE INVENTION

It is therefore an object of the present invention to provide a method of fabricating a semiconductor, capable of solving the shallow junction damage problem when forming the self-aligned metal silicide layer, wherein no short circuit problem occurs and no high temperature treatment is needed.

In accordance with the object of the present invention, a fabrication process for forming a semiconductor device with elevated source/drain regions on a substrate is disclosed. Before forming the semiconductor device, an elevated silicon layer is provided on portions of the substrate that will form the source/drain regions. The elevated silicon layer is isolated from a portion of the substrate that will form a gate electrode. Hence, a sidewall spacer can be formed therebetween, and the problem of a short circuit between the gate electrode and source/drain regions can be prevented.

Next, a gate dielectric layer and a gate electrode layer are successively formed on the elevated silicon layer. By using an appropriate etching process, a gate structure is fabricated. Thereafter, as in the current MOS device process, a lightly doped ion implantation, a sidewall spacer, and a heavily doped ion implantation are applied accordingly. The elevated silicon layer is then used as a reactant for performing a self-aligned silicidization process. Consequently, even if some silicon ingredient of the silicon substrate is consumed in the silicidization process, there is no apparent influence on the shallow junction structure.

In a preferred embodiment of the present invention, the elevated silicon layer is made of polysilicon. The thickness of the polysilicon layer is varied depending on the amount of sputtered metal layer and the reaction conditions of the silicidization.

According to the present invention, the elevated silicon layer can be formed by the following two methods:

In a first method, a sacrificial dielectric layer is formed on the substrate. A photolithography and etching process is then performed on the sacrificial dielectric layer to form a gate electrode mask on a portion of the substrate that will form a gate electrode. Next, a silicon layer is formed overlying the gate electrode mask and the substrate. The portion of the silicon layer over the gate electrode mask and its adjacent area is then removed, thereby forming an elevated silicon layer for forming the source/drain regions of a semiconductor, device. This can be accomplished either by using a modified gate electrode photomask or by performing a chemical-mechanical polishing (CMP) process. Finally, the gate electrode mask is removed to complete the fabrication of the elevated silicon layer.

In a second method, a silicon layer and a dielectric layer are successively formed on the substrate. Next, by using a gate electrode photomask, a photolithography and etching process is performed to the dielectric layer so as to reveal the silicon layer over a portion of the substrate that will form a gate electrode. A thermal oxidization process is then performed to convert the revealed silicon into a thermal oxide layer. Finally, the thermal oxide layer and the remaining portion of the dielectric layer are removed to complete the fabrication of the elevated silicon layer.

BRIEF DESCRIPTION OF THE DRAWINGS

Other objects, features, and advantages of the present invention will become apparent by way of the following detailed description of preferred but non-limiting embodiments. The description is made with reference to the accompanying drawings in which.

DESCRIPTION OF THE PREFERRED EMBODIMENTS

The way this invention overcomes the problem of shallow junction damage is to reduce the consumption of intrinsic silicon in the source/drain regions by providing additional silicon. However, compared to the prior art technology, the sequence of processing steps is significantly different. In the conventional method, the elevated source/drain regions of a MOS device are formed after the device has been fabricated on a substrate by performing a selective epitaxial process or an ion implantation process. As mentioned in the above description, the prior art approach will raise the production cost and result in other problems. On the other hand, this invention discloses a novel method of forming an elevated silicon layer on the source/drain regions of the substrate before the device fabrication process. Thus, a simpler method can be used to form such an elevated silicon layer to overcome the problems of the prior art. Several embodiments of this invention are now described by referring to the following drawings.

Embodiment 1

Figure 3:
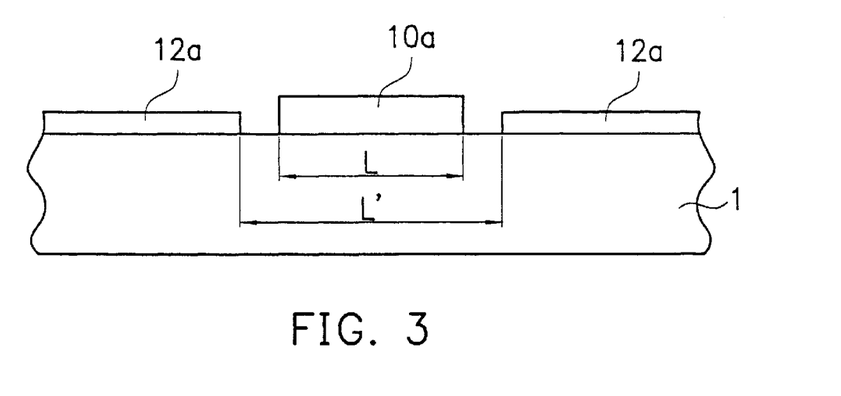
Figure 4:
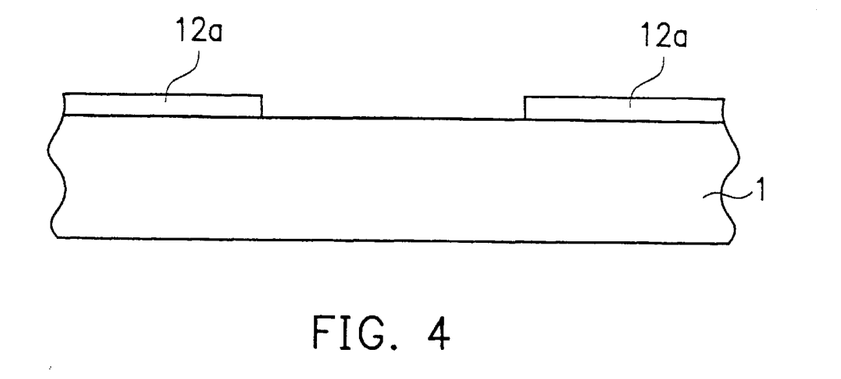
Figure 5:
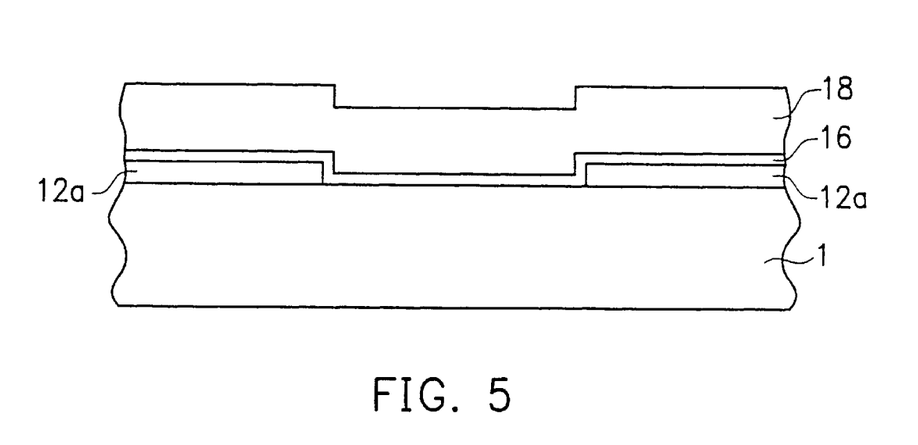
Figure 6:
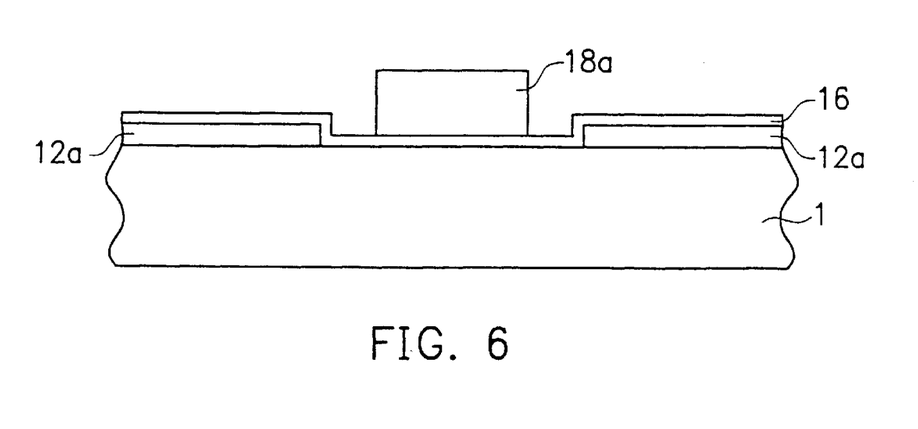
Figure 7:
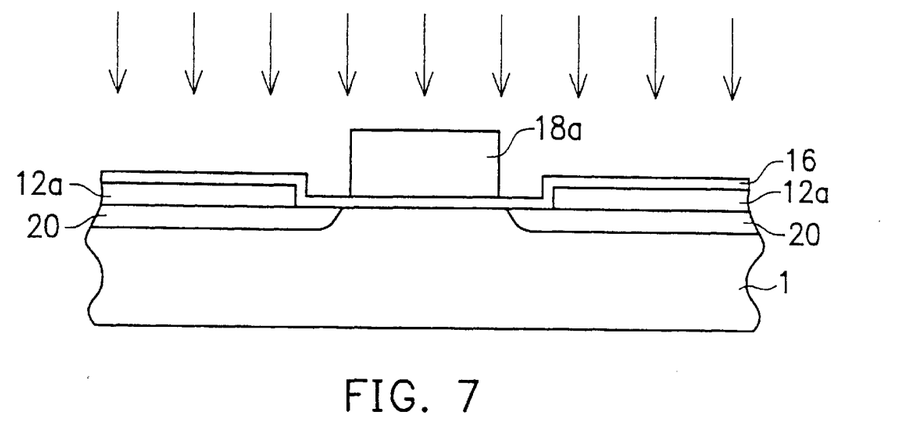
Figure 8:
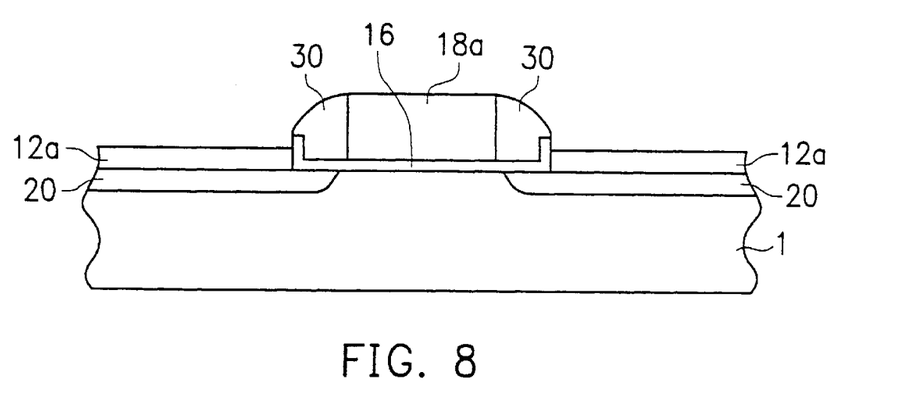
Figure 9:
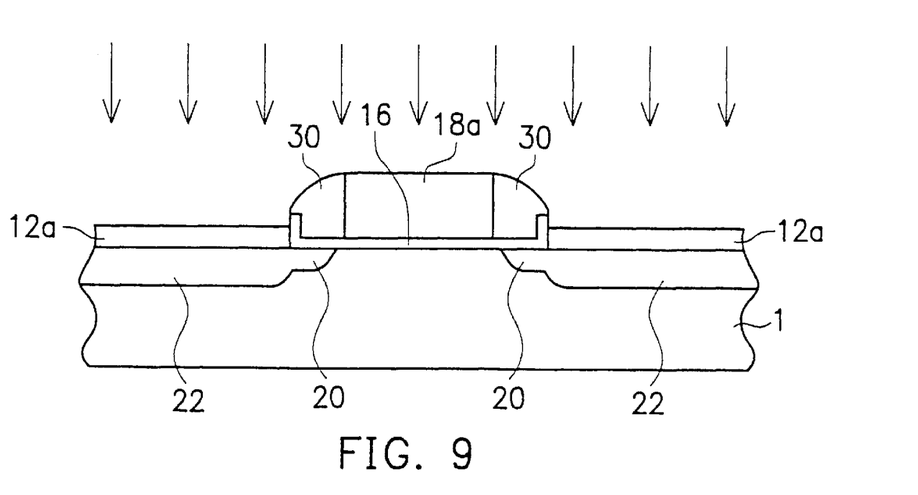
Figure 10:
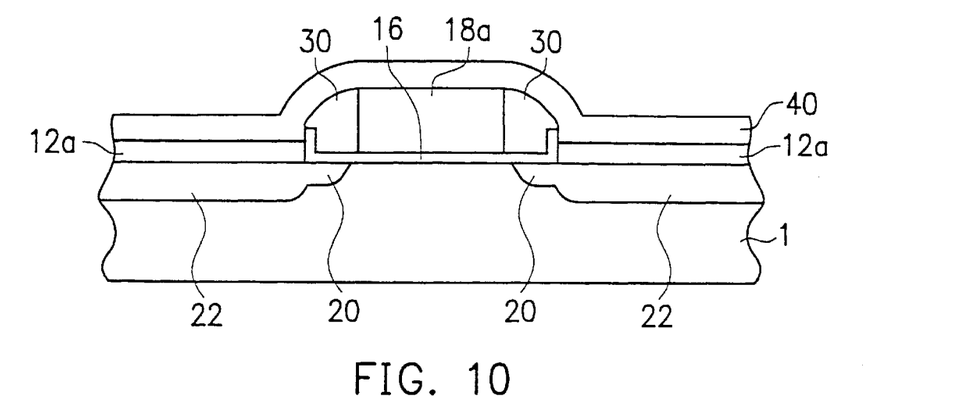
Figure 11:
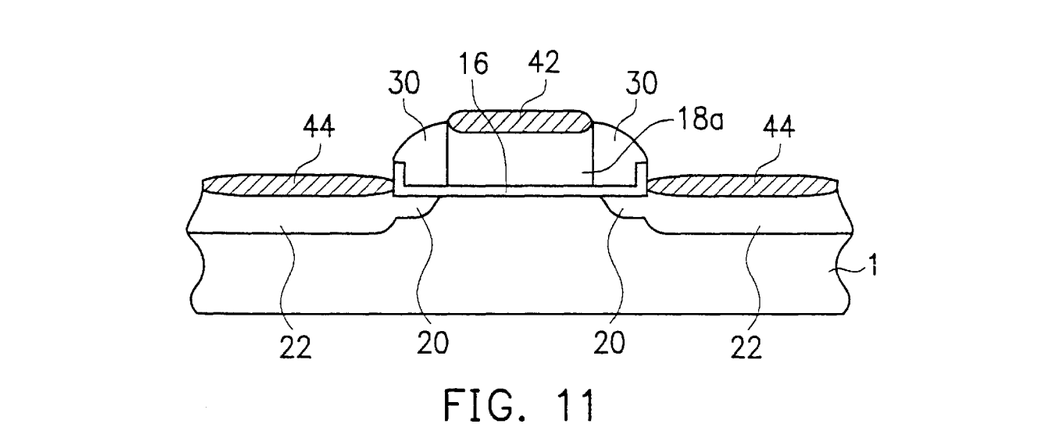

FIGS. 1 to 11 are cross-sectional diagrams schematically illustrating the fabrication process in accordance with a first embodiment of the present invention. As mentioned in the above description, the most important character of this invention is the sequence of forming the elevated source/drain regions and the MOS device. We provide the elevated silicon layer before the fabrication of the MOS device. Referring to FIGS. 1 to 11, the processing steps of fabricating a MOS device of Embodiment 1 are described in detail. The processing steps of this embodiment can be divided into four stages: forming elevated source/drain regions (as shown in FIGS. 1 to 4); forming a gate structure (as shown in FIGS. 5 and 6); forming source/drain regions with lightly-doped drain structure (as shown in FIGS. 7 to 9); and forming the self-aligned metal silicide (as shown in FIGS. 10 and 11).

Figure 1:
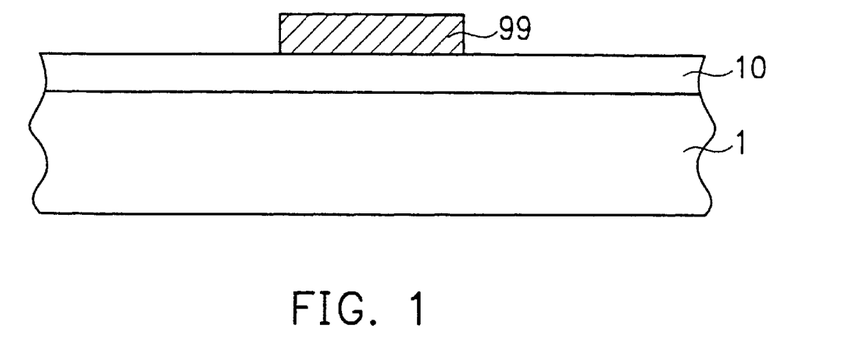
FIGS. 1 to 11 are cross-sectional diagrams schematically illustrating the fabrication process in accordance with a first embodiment of the present invention.

A. formation of an elevated source/drain regions:

Referring to FIG. 1, a sacrificial oxide layer 10 is formed on a silicon substrate 1. The sacrificial oxide layer 10 is used to protect an area of the silicon substrate 1 that will form a gate electrode of a MOS device from being contaminated. In this embodiment, the thickness of the sacrificial oxide layer 10 is in a range of about several hundreds angstrom (Å). It can be formed by a chemical-vapor deposition process or by other suitable deposition technology. Furthermore, although an oxide layer is described in this embodiment, some other dielectric materials can be used as well. Next, a photoresist layer 99 is coated on the sacrificial oxide layer 10, and then patterned by using a gate photomask to cover an area that will form a gate electrode.

Figure 2:
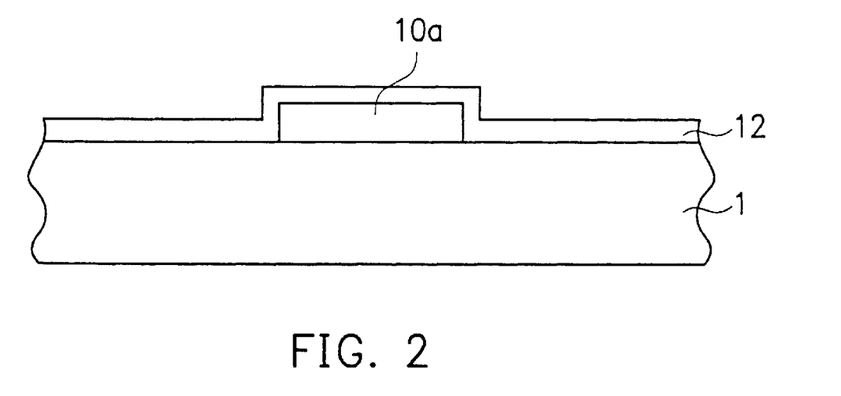

Referring to FIG. 2, the sacrificial oxide layer 10 is etched using the patterned photoresist layer 99 as a mask, thereby forming a gate electrode mask 10a covering a portion of the silicon substrate 1 that will form a gate electrode of a MOS device. Then, a polysilicon layer 12 is deposited overlying the gate electrode mask 10a and the silicon substrate 1. The polysilicon layer 12 is provided to form the elevated source/drain regions of a MOS device. The thickness of the polysilicon layer 12 depends on the later self aligned silicidization process. As mentioned in the above description, the elevated source/drain regions are used to react with the metal layer to form a metal silicide layer, thereby reducing the consumption of intrinsic silicon in the source/drain regions. Therefore, the needed thickness of the polysilicon layer 12 is determined by the thickness of the metal layer for forming the metal silicide and its reaction time. In this embodiment, the polysilicon layer 12 is deposited to a thickness of between 200 Å to 400 Å However, it can be varied depending on the real manufacturing conditions.

Referring to FIG. 3, by using a modified photomask that adds a certain increment (i.e. L'-L) to the original gate electrode pattern, a portion of the polysilicon layer 12 over the gate electrode mask 10a and its adjacent area are removed, thereby forming an elevated polysilicon layer 12a. There are two things to be described. First, the use of increment (L'-L) can not only reserve an area for forming a sidewall spacer, but can also separate the gate electrode from the source/drain regions of the MOS device to prevent the short circuit problem. Second, the gate electrode mask 10a is used to protect the channel area of the silicon substrate 1. That is, the etching process will not damage the channel area of the silicon substrate 1 and vary its properties.

Finally, referring to FIG. 4, the gate electrode mask 10a is removed by using B.O.E. or HF solution. Hence, the portions for forming source/drain regions of a MOS device are elevated.

B. formation of a gate structure:

After providing a polysilicon layer to elevate the source/drain regions of the MOS device, the steps of forming a gate structure are conducted thereon. As shown in FIG. 5, a gate oxide layer 16 and a polysilicon gate electrode layer 18 are successively formed on the elevated polysilicon layer 12 and the exposed surface of the silicon substrate 1. Usually, the gate oxide layer 16 is a fairly thin layer and is used as an intermediate material. On the other hand, the polysilicon gate electrode layer 18 is used to form an electrode after implanting with an appropriate impurity.

Referring to FIG. 6, a photolithography and etching process is performed on the polysilicon gate electrode layer 18 by using a gate electrode photomask to form a gate structure 18a. Please note that in FIG. 6 the gate oxide layer 16 outside the gate structure 18a is not removed concurrently. There is one advantage of preserving the gate oxide layer 16. In a later source/drain regions implantation process, the gate oxide layer 16 can act as a buffer layer to prevent the elevated polysilicon layer 12 from being impacted directly. However, if the manufacturing process so requires, the gate oxide layer 16 can be removed as well. Finally, as shown in FIG. 6, a gate structure 18a is fabricated on the silicon substrate1.

C. formation of lightly and heavily doped source/drain regions:

Source/drain regions of a MOS device are now formed. In the present embodiment, the fabrication of a lightly doped drain (LDD) MOS device is described; however, other types of MIOS devices are also acceptable. First, an ion implantation process with light dosage is applied to the structure of FIG. 6. Thus, lightly doped source/drain regions 20 are formed on the silicon substrate 1, as shown in FIG. 7.

Next, a sidewall spacer 30 is formed on the sidewall of the gate structure 18a, as shown in FIG. 8. Normally, the sidewall spacer 30 is formed by first depositing a conformal dielectric layer, such as a silicon nitride layer or a silicon oxide layer, overlying the entire surface of the substrate. An anisotropic etching process is then applied to the dielectric layer. Since a portion of the dielectric layer on the sidewall of the gate structure has a larger thickness in vertical direction, a sidewall spacer 30 could remain on the sidewall of the gate structure after this etching process. In the present step, the gate oxide layer 16 over the elevated polysilicon layer 12a is removed together with the anisotropic etching process to form the sidewall spacer 30.

As shown in FIG. 9, another ion implantation process with heavy dosage is applied to the substrate by using the gate structure 18a as well as the sidewall spacer 30 as a mask, thereby forming heavily doped source/drain regions 22 in the lightly doped source/drain regions 20. Therefore, a lightly doped drain-type MOS device is fabricated and the elevated polysilicon layer 12a is still uncovered. The detailed process sequence and conditions of this embodiment resemble those of the prior art LDD process. Hence, no further description is needed.

D. formation of self-aligned metal silicide:

The elevated polysilicon layer 12a is now applied in the execution of a self-aligned silicidization process. As shown in FIG. 10, a titanium (Ti) layer 40 is sputtered overlying the entire MOS device. The titanium layer 40 is used as a metal reactant of the silicidization. However, as known by a person skilled in the art, other appropriate metal materials can be used as well.

The metal silicidization process is then conducted. First, by applying a rapid thermal anneal (RTA) treatment, the titanium layer 40 reacts with the polysilicon layer of the gate structure 18a as well as the elevated polysilicon layer 12a (i.e. source/drain regions) to form titanium silicide (TiSi$_x$) layers 42 and 44. The titanium silicide is formed to reduce the contact resistance of the electrodes of the MOS device. Next, the un-reacted portion of the titanium layer 40, especially the portion over the sidewall spacer 30, is removed by a wet etching process. Thus, as shown in FIG. 11, titanium silicide layers 42 and 44 are fabricated on the polysilicon layer of the gate structure 18a and the elevated polysilicon layer 12a respectively. In this embodiment, the titanium silicide layer 44 over the source/drain regions is produced mainly from the silicon provided by the elevated polysilicon layer 12a. Consequently, even if some silicon ingredient of the silicon substrate 1 is consumed in the silicidization process, there is no apparent influence on the shallow junction structure.

In accordance with the processing steps of this embodiment, the source/drain regions can be elevated to conduct the metal silicidization process with none of the problems associated with the prior art method occurring. For example, it is not necessary to use a high temperature process in forming the elevated polysilicon layer 12a. Furthermore, since the elevated polysilicon layer 12a is formed before the fabrication the MOS device on the substrate, its location over the source/drain regions can be precisely controlled. This prevents short circuit problems even after the silicidization process.

Embodiment 2

As mentioned in the above description, the characteristic of this invention is that the elevated source/drain regions should be formed before the MOS device fabricating process. Therefore, the elevation of the source/drain regions is not limited to the method shown in FIGS. 1 to 4. This embodiment describes another method of forming elevated source/drain regions before the fabrication of the MOS device.

FIGS. 12 to 15 are cross-sectional diagrams schematically illustrating the fabrication process of form elevated source/drain regions in accordance with a second embodiment of the present invention. The process shown in FIGS. 12 to 15 can be used to replace the process shown in FIGS. 1 to 4 of embodiment 1. The following steps are the same as those shown in FIGS. 5 to 11.

Figure 12:
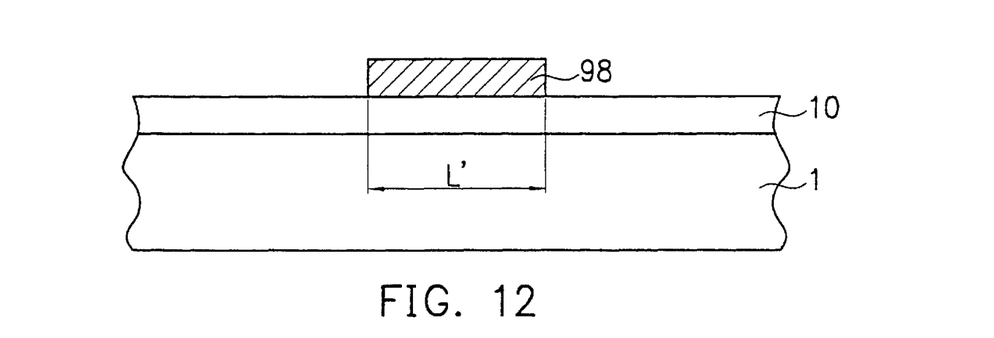
FIGS. 12 to 15 are cross-sectional diagrams schematically illustrating the fabrication process in accordance with a second embodiment of the present invention, and especially the processing steps for forming an elevated polysilicon layer.

In FIG. 12, as described in embodiment 1, a sacrificial oxide layer 10 is formed on a silicon substrate 1. In this embodiment, the sacrificial oxide layer 10 is also used to protect an area of the silicon substrate 1 that will form a gate electrode of a MOS device from being contaminated. The thickness of the sacrificial oxide layer 10 is in a range of about several hundreds angstrom (Å). It can be formed by a chemical-vapor deposition process or by other suitable deposition technology. Next, a photoresist layer 98 is coated on the sacrificial oxide layer 10, and then patterned by using a gate photomask to cover an area that will form a gate electrode. However, differing from the embodiment 1, the width of the patterned photoresist layer 98 is L'—the width of the gate electrode plus a certain increment. The other treatments are the same as those shown in embodiment 1.

Figure 13:
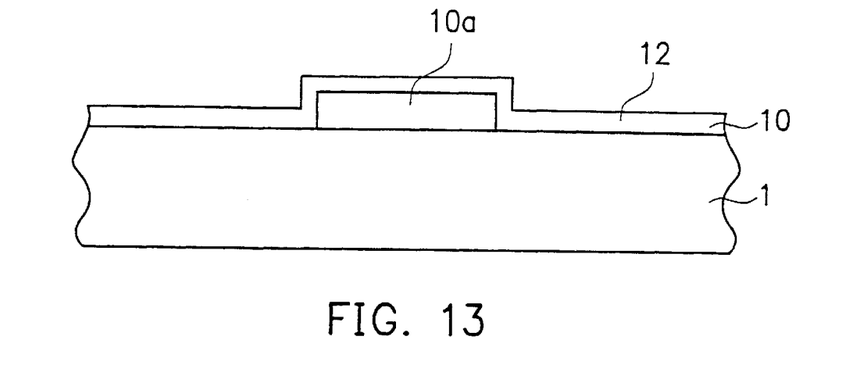

Referring to FIG. 13, by using the patterned photoresist layer 98 as a mask, the sacrificial oxide layer 10 is etched to form a gate electrode mask 10a on a portion of the silicon substrate 1 that will form a gate electrode of a MOS device. Then, a polysilicon layer 12 is deposited overlying the gate electrode mask 10a and the silicon substrate 1. The property of the polysilicon layer 12 is the same as that of the embodiment 1. No further description is needed.

Figure 14:
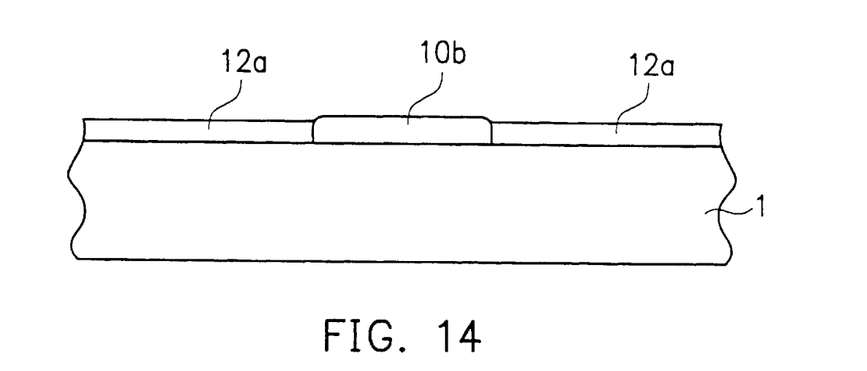

The next step is different from that of the embodiment 1. Referring to FIG. 14, a chemical mechanical polishing (CMP) process is applied to the polysilicon 12 and the gate electrode mask 10a to conduct a planarization treatment. The upper portion of the gate electrode mask 10a is removed, leaving the remaining portion to form a new gate electrode mask 10b. A portion of the polysilicon layer 12 over the gate electrode mask 10a and its adjacent area is removed also, resulting in the elevated polysilicon layer 12a.

In this step, the gate electrode mask 10a is used as stuffing material to reserve an area of the silicon substrate 1 for the formation of a gate electrode between the elevated polysilicon layer 12.

Figure 15:
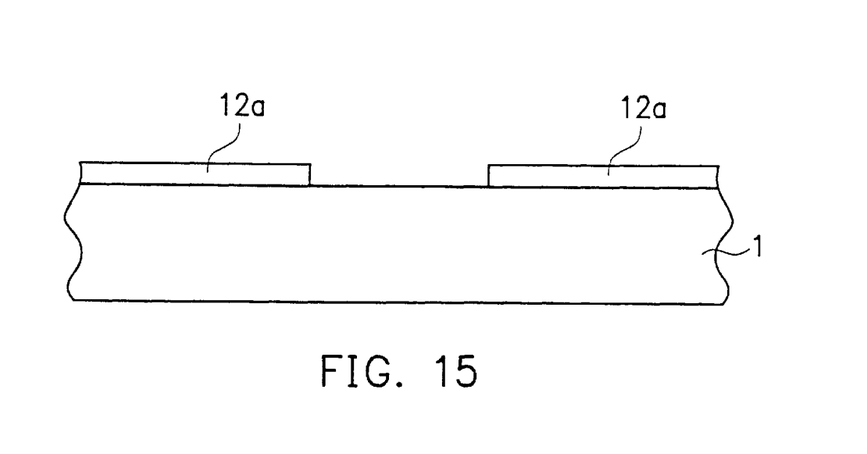

Finally, referring to FIG. 15, B.O.E. or HF solution is used to remove the gated electrode mask 10b. Hence, the portions for forming source/drain regions of a MOS device are elevated.

Using the method of fabricating elevated source/drain regions in accordance with this embodiment can achieve every advantage of embodiment 1. Furthermore, one photolithography process step can be eliminated because a CMP process is applied instead. However,. the total number of photomasks is not changed since both of embodiment 1 and 2 require a photomask to define the gate electrode area.

Embodiment 3

Figure 16:
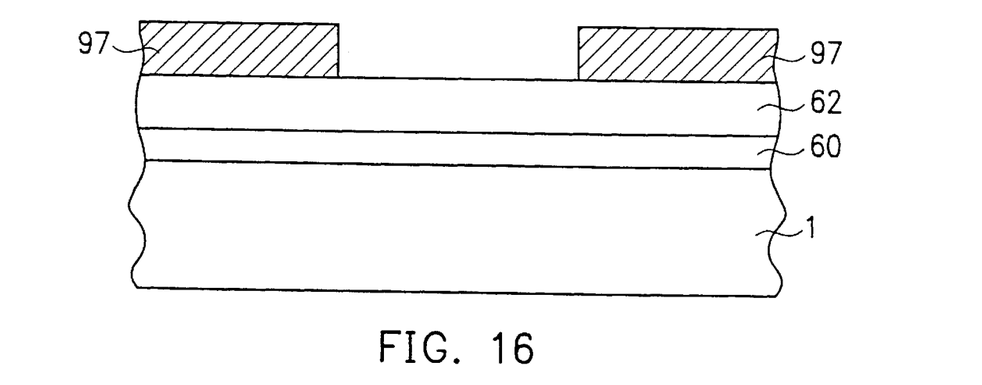
FIGS. 16 to 18 are cross-sectional diagrams schematically illustrating the fabrication process in accordance with a third embodiment of the present invention, and especially the processing steps for forming an elevated polysilicon layer.
Figure 17:
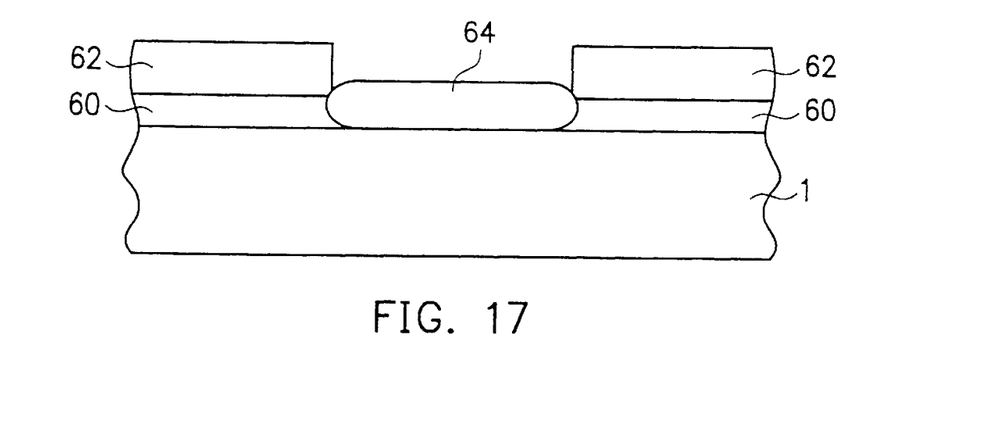
Figure 18:
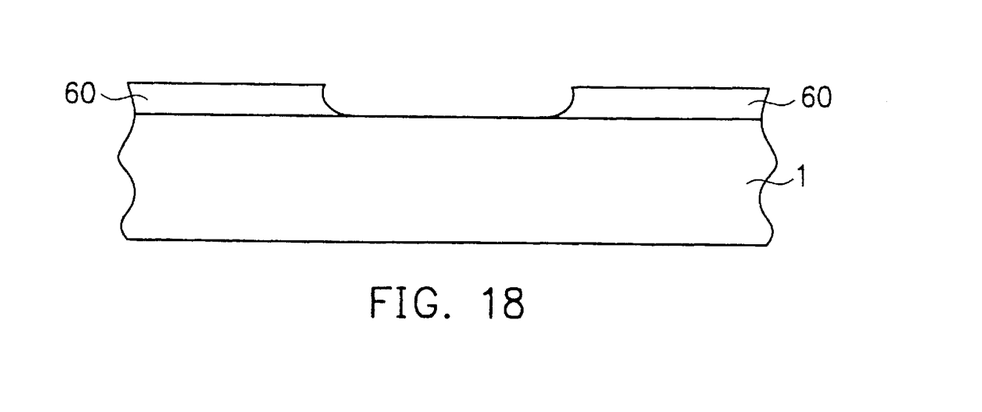

This embodiment resembles embodiment 2. Both of them disclose another way to fabricate elevated source/drain regions. In this embodiment, a thermal oxidation process is used to define the polysilicon source/drain regions. FIGS. 16 to 18 are cross-sectional diagrams schematically illustrating the fabrication process of forming elevated source/drain regions in accordance with a third embodiment of the present invention.

As shown in FIG. 16, a polysilicon layer 60 and a dielectric layer 62, such as a silicon nitride layer, are successively formed on a silicon substrate 1. The polysilicon layer 60 is used to elevate the source/drain regions of the silicon substrate 1. Next, a photoresist layer 97 is coated on the dielectric layer 62, and then patterned by using a gate photomask to cover an area that will form a gate electrode. Again, a certain increment is added to the gate electrode mask to prevent short circuit problems between the gate electrode and the source/drain regions.

Then, by using the patterned photoresist layer 97 as a mask, a portion of the dielectric layer 62 is removed by a dry etching process. This reveals a portion of the polysilicon layer 60 located on an area that will form a gate electrode of a MOS device. After that, the revealed polysilicon layer 60 is oxidized by a thermal oxidation process, thereby forming a thermal oxide layer 64, as shown in FIG. 17. In the mean time, the unreacted polysilicon layer 60 around the thermal oxide layer 64 forms the elevated source/drain regions of a MOS device.

Finally, the dielectric layer 62 of silicon nitride is removed by using a hot phosphoric acid. The thermal oxide layer 64 is then removed by using B.O.E. or HF solution. This resulting structure is shown in FIG. 18. Apparently, this embodiment is capable of forming elevated source/drain regions as we desired.

In the above embodiments 1, 2, and 3, we disclose three different ways to elevate the source/drain regions before the fabrication of a MOS device. Please note that it is not possible to define the elevated source/drain regions precisely by a direct etching of the polysilicon layer since the etching selectivity of polysilicon to silicon is low. Therefore, this invention discloses other schemes to accomplish it. In the embodiments 1 and 2, it is accomplished by using a sacrificial oxide layer. In the embodiment 3, a thermal oxidation process is used to transform the undesired portion of the polysilicon layer into a thermal oxide. However, the methods of this invention are not limited to the above three embodiments. In contrast, any method that can elevate the source/drain regions before the fabrication of a MOS device would be acceptable.

While the invention has been described by way of examples and in terms of preferred embodiments, it is to be understood that the invention is not limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating a semiconductor device with elevated source/drain regions, comprising the steps of:

forming a silicon layer on a substrate;

forming a dielectric layer on said silicon layer;

performing, by using a gate electrode photomask, a photolithography and etching process to said dielectric layer to reveal a portion of said silicon layer;

oxidizing said revealed silicon layer to form a thermal oxide layer;

removing said thermal oxide layer and the remaining portion of said dielectric layer, so as to form an elevated silicon layer for forming source/drain regions of a semiconductor device;

forming a gate dielectric layer overlying said elevated silicon layer and an exposed surface of said substrate;

forming a gate electrode layer on said gate dielectric layer;

selectively etching said gate electrode layer to form a gate structure;

performing a lightly doped ion implantation process to said elevated silicon layer and said substrate;

forming a spacer on a sidewall of said gate structure; and performing a heavily doped ion implantation process to said elevated silicon layer and said substrate.

2. A method of fabricating a semiconductor device with elevated source/drain regions according to claim 1, wherein said elevated silicon layer is made of polysilicon, and the thickness of said elevated silicon layer is determined by the amount of the metal layer for forming metal silicide and its reaction condition.

3. A method of fabricating a semiconductor device with elevated source/drain regions, comprising the steps of:

forming a silicon layer on a substrate;

forming a dielectric layer on said silicon layer;

performing, by using a gate electrode photomask, a photolithography and etching process to said dielectric layer to reveal a portion of said silicon layer;

oxidizing said revealed silicon layer to form a thermal oxide layer;

removing said thermal oxide layer and the remaining portion of said dielectric layer, so as to form an elevated silicon layer for forming source/drain regions of a semiconductor device;

forming a gate structure comprising a gate dielectric layer and a gate electrode layer on said substrate, wherein the gate electrode layer of said gate structure is isolated from said elevated silicon layer;

performing an ion implantation process to said elevated silicon layer and said substrate to form source/drain regions of a semiconductor device; and whereby in a later metallization process, said elevated silicon layer can react with a metal layer to form a self-aligned metal silicide layer on said source/drain regions.

4. A method of fabricating a semiconductor device with elevated source/drain regions according to claim 3, wherein said elevated silicon layer is made of polysilicon, and the thickness of said elevated silicon layer is determined by the amount of the metal layer for forming metal silicide and its reaction condition.

5. A method of fabricating a semiconductor device with elevated source/drain regions, comprising the steps of:

forming a silicon layer on a substrate;

forming a dielectric layer on said silicon layer;

performing, by using a gate electrode photomask, a photolithography and etching process to said dielectric layer to reveal a portion of said silicon layer;

oxidizing said revealed silicon layer to form a thermal oxide layer;

removing said thermal oxide layer and the remaining portion of said dielectric layer, so as to form an elevated silicon layer for forming source/drain regions of a semiconductor device;

forming a gate structure comprising a gate dielectric layer and a gate electrode layer on said substrate, wherein the gate electrode layer of said gate structure is isolated from said elevated silicon layer;

performing an ion implantation process to said elevated silicon layer and said substrate to form source/drain regions of a semiconductor device; and forming a metal layer on said gate structure and said source/drain regions; and thermally reacting said metal layer with said elevated silicon layer, so as to form a self-aligned metal silicide layer on said source/drain regions.

* * * * *